US008618965B2

(12) United States Patent
Heliö et al.

(10) Patent No.: US 8,618,965 B2
(45) Date of Patent: Dec. 31, 2013

(54) CALIBRATION OF A CHARGE-TO-DIGITAL TIMER

(75) Inventors: Petri Heliö, Tampere (FI); Petri Korpi, Kangasala (FI); Paavo Väänänen, Nokia (FI)

(73) Assignee: ST-Ericsson SA, Plan-les-Quates (CH)

( * ) Notice: Subject to any disclaimer, the term of this patent is extended or adjusted under 35 U.S.C. 154(b) by 53 days.

(21) Appl. No.: 13/338,550

(22) Filed: Dec. 28, 2011

(65) Prior Publication Data

US 2013/0169455 A1 Jul. 4, 2013

(51) Int. Cl.
*H03M 1/10* (2006.01)

(52) U.S. Cl.
USPC .......................................... 341/120; 341/155

(58) Field of Classification Search
USPC ............ 341/144, 155, 143, 118, 120; 331/16, 331/44; 327/156, 157
See application file for complete search history.

(56) References Cited

U.S. PATENT DOCUMENTS

| | | | | |
|---|---|---|---|---|
| 5,886,660 | A | 3/1999 | Loewenstein | |
| 6,756,699 | B2 | 6/2004 | Hartmann et al. | |
| 6,850,102 | B2 * | 2/2005 | Hsu et al. | 327/157 |
| 6,870,411 | B2 * | 3/2005 | Shibahara et al. | 327/156 |
| 7,095,287 | B2 * | 8/2006 | Maxim et al. | 331/44 |
| 7,173,558 | B2 * | 2/2007 | Demirdag et al. | 341/172 |
| 7,426,377 | B2 * | 9/2008 | Tanaka et al. | 455/255 |
| 7,609,756 | B2 | 10/2009 | Wood | |
| 7,667,633 | B2 | 2/2010 | Choi et al. | |
| 7,791,428 | B2 | 9/2010 | Chang et al. | |
| 8,363,033 | B2 * | 1/2013 | Chen et al. | 345/174 |
| 2006/0017603 | A1 | 1/2006 | Demirdag et al. | |
| 2006/0121858 | A1 | 6/2006 | Tanaka et al. | |
| 2009/0072911 | A1 * | 3/2009 | Ke et al. | 331/16 |
| 2010/0238057 | A1 | 9/2010 | Wood | |
| 2010/0244971 | A1 | 9/2010 | Wang et al. | |

FOREIGN PATENT DOCUMENTS

| | | | |
|---|---|---|---|
| DE | 3834938 | C1 | 12/1989 |
| EP | 0662650 | A2 | 7/1995 |
| EP | 2388923 | A1 | 11/2011 |
| FR | 2224759 | A1 | 10/1974 |
| WO | 2008088986 | A2 | 7/2008 |

OTHER PUBLICATIONS

Staszewski, R. B., et al., "All-Digital TX Frequency Synthesizer and Discrete-Time Receiver for Bluetooth Radio in 130-nm CMOS", IEEE Journal of Solid-State Circuits, Dec. 1, 2004, pp. 2278-2291, vol. 39, Issue 12, IEEE Solid-State Circuits Society.
Dawson, J. W., et al., "Fast TDC for On-line TOF Using Monolithic Flash A/D Converter", IEEE Transactions on Nuclear Science, Feb. 1, 1981, pp. 610-612, vol. NS-28, No. 1, IEEE.

(Continued)

*Primary Examiner* — Peguy Jean Pierre
(74) *Attorney, Agent, or Firm* — Coats & Bennett, P.L.L.C.

(57) ABSTRACT

A calibration method disclosed herein calibrates at least one of a capacitive load and a charging current controlling a charge-to-digital timer (CDT). In general, the disclosed calibration method measures multiple calibration phases based on start and stop signals separated by a known time difference, and therefore having a known phase, and adjusts at least one of the capacitive load and the charging current of the CDT based on the measured calibration phases. In so doing, the disclosed calibration method reduces power dissipation and peak supply currents over the frequency range of the CDT.

14 Claims, 15 Drawing Sheets

(56) References Cited

OTHER PUBLICATIONS

Napolitano, P., et al., "A Novel Sample-and-Hold-Based Time-to-Digital Converter Architecture", IEEE Transactions on Instrumentation and Measurement, May 1, 2010, pp. 1019-1026, vol. 59, Issue 5, IEEE Instrumentation and Measurement Society.

Staszewski, R. B., et al., "Time-to-Digital Converter for RF Frequency Synthesis in 90 nm CMOS", Radio Frequency integrated Circuits (RFIC) Symposium, Digest of Papers, Jun. 12, 2005, pp. 473-476, IEEE.

Hsu, C-M., et al., "A Low-Noise Wide-BW 3.6-GHz Digital ΔΣ Fractional-N Frequency Synthesizer With a Noise-Shaping Time-to-Digital Converter and Quantization Noise Cancellation", IEEE Journal of Solid-State Circuits, Dec. 1, 2008, pp. 2276-2786, vol. 43, No. 12, IEEE.

Galton, I., "Analog-Input Digital Phase-Locked Loops for Precise Frequency and Phase Demodulation", IEEE Transactions on Circuits and Systems -II: Analog and Digital Signal Processing, Oct. 1, 1995, pp. 621-630, vol. 42, No. 10, IEEE.

* cited by examiner

GAIN ERROR MEASUREMENT IN DIGITAL PHASE DETECTOR

Icharge TUNING ACCORDING TO GAIN ERROR

RESULTING FREQUENCY ERROR

CALIBRATION OF A CHARGE-TO-DIGITAL TIMER

The invention described herein generally relates to time-to-digital converters that measure a time difference separating two signals, and more particularly relates to calibrating a charge-to-digital timer.

BACKGROUND

Many electronic circuits use Time-to-Digital Converters (TDCs) to measure the time difference separating two signals, e.g., a start signal and a stop signal, and to provide the time difference in digital form. One exemplary application for a TDC comprises a Radio Frequency (RF) circuit, where a TDC may be used to measure the time difference between a reference signal and an oscillator signal in a Phase-Locked Loop (PLL). TDCs may also be used to detect light/photons in nuclear medical imaging, e.g., Positron Emission Tomography (PET), for Time-Of-Flight (TOF) measurements, e.g., in radiation detection and in laser radars, and in a variety of other space, nuclear, and measurement science applications.

One type of TDC comprises a Charge-to-Digital Timer (CDT). The basic architecture for a conventional CDT comprises a current source, an integrator, and a flash analog-to-digital converter, such as disclosed in "Fast TDC for On-Line TOF Using Monolithic Flash A/D Converter," J. Dawson, D. Underwood, IEEE Transactions on Nuclear Science, vol. NS-28, no. 1, February 1981. At the time of the Dawson et al. paper, the CDT was implemented using discrete components and a separate flash analog-to-digital converter.

Another exemplary TDC comprises a Vernier Delay Line (VDL), which uses a Complementary Metal-Oxide Semiconductor (CMOS) buffer/inverter delay to measure the time difference between the start and stop signals. By using tapped delay lines, the TDC may achieve resolutions smaller than those achievable with a single inverter delay. For example, a VDL may achieve ~20 ps resolution with a 65 nm CMOS process.

In general, TDCs used for PLLs rely on delay line based phase quantization. If the delay line is fixed, quantization noise will increase as a function of the output frequency of the oscillator in the PLL. While conventional solutions may adjust the delay line relative to the oscillator output frequency, such efforts typically increase the power dissipation of the PLL as the frequency increases. Increased power dissipation not only reduces the battery life of the device containing the PLL, but it also increases clock interference, which may disturb the operation of the PLL. Further, because delay cells in the delay line create high peak supply currents, it is difficult to maintain the supply voltage of the TDC at a constant level. Variations in the TDC supply voltage modulate the TDC measurement result and cause unwanted modulation of the PLL oscillator. Because the amount of modulation directly depends on the frequency, it is hard to characterize the phase quantization device accurately using conventional calibration techniques.

Thus, there remains a need for improved calibration techniques for TDCs.

SUMMARY

The calibration method disclosed herein calibrates at least one of a capacitive load and a charging current controlling a charge-to-digital timer to address at least some of the above-described problems associated with conventional calibration techniques. In general, the calibration method disclosed herein measures multiple calibration phases based on multiple start and stop signals separated by known time differences, and therefore having known phases, and adjusts at least one of the capacitive load and the charging current of the charge-to-digital timer based on the measured calibration phases. In so doing, the disclosed calibration method optimizes the quantization step to minimize the quantization noise over a large frequency range.

One exemplary method initializes a capacitive load and a charging current of a charge-to-digital timer. Subsequently, first start and stop signals separated in time by a first number of oscillator cycles are applied to the charge-to-digital timer to measure a first calibration phase during a first calibration time period, and second start and stop signals separated in time by a second number of oscillator cycles are applied to the charge-to-digital timer to measure a second calibration phase during a second calibration time period. The second number of oscillator cycles has a known relationship to the first number of oscillator cycles. The calibration method further includes adjusting at least one of the capacitive load and the charging current based on the first and second calibration phases.

In some embodiments, the calibration method is implemented responsive to a calibration instruction during an open-loop process independent from closed-loop operations of the charge-to-digital timer, where the closed-loop operations are used to measure unknown time differences between start and stop signals. In other embodiments, the calibration method is continuously implemented in parallel with the closed-loop operations of the charge-to-digital timer.

DETAILED DESCRIPTION

The calibration method disclosed herein calibrates at least one of a capacitive load and a charging current controlling a charge-to-digital timer based on calibration phases measured by the charge-to-digital timer for known time differences having corresponding known phases. While the calibration method disclosed herein generally applies to charge-to-digital timers, it will be appreciated that the disclosed calibration method may apply to other time-to-digital converters.

Figure 1:
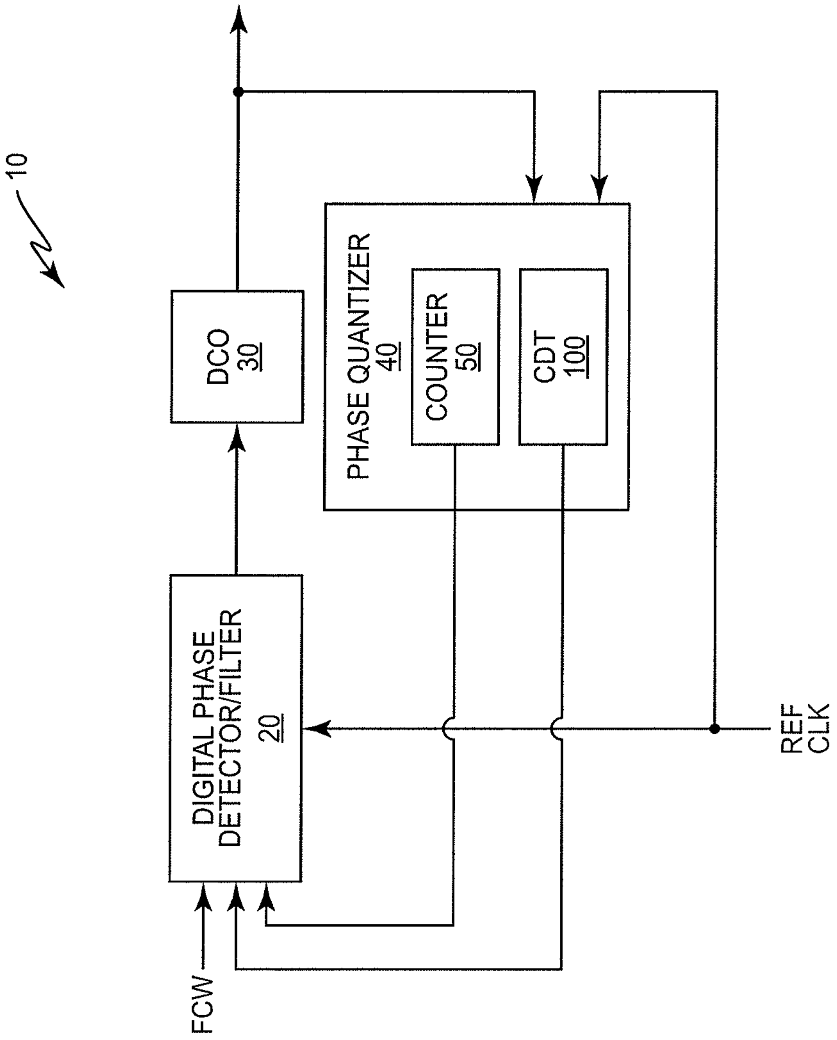
FIG. 1 depicts a block diagram of a digital phase-locked loop (DPLL) according to one exemplary embodiment.
Figure 2:
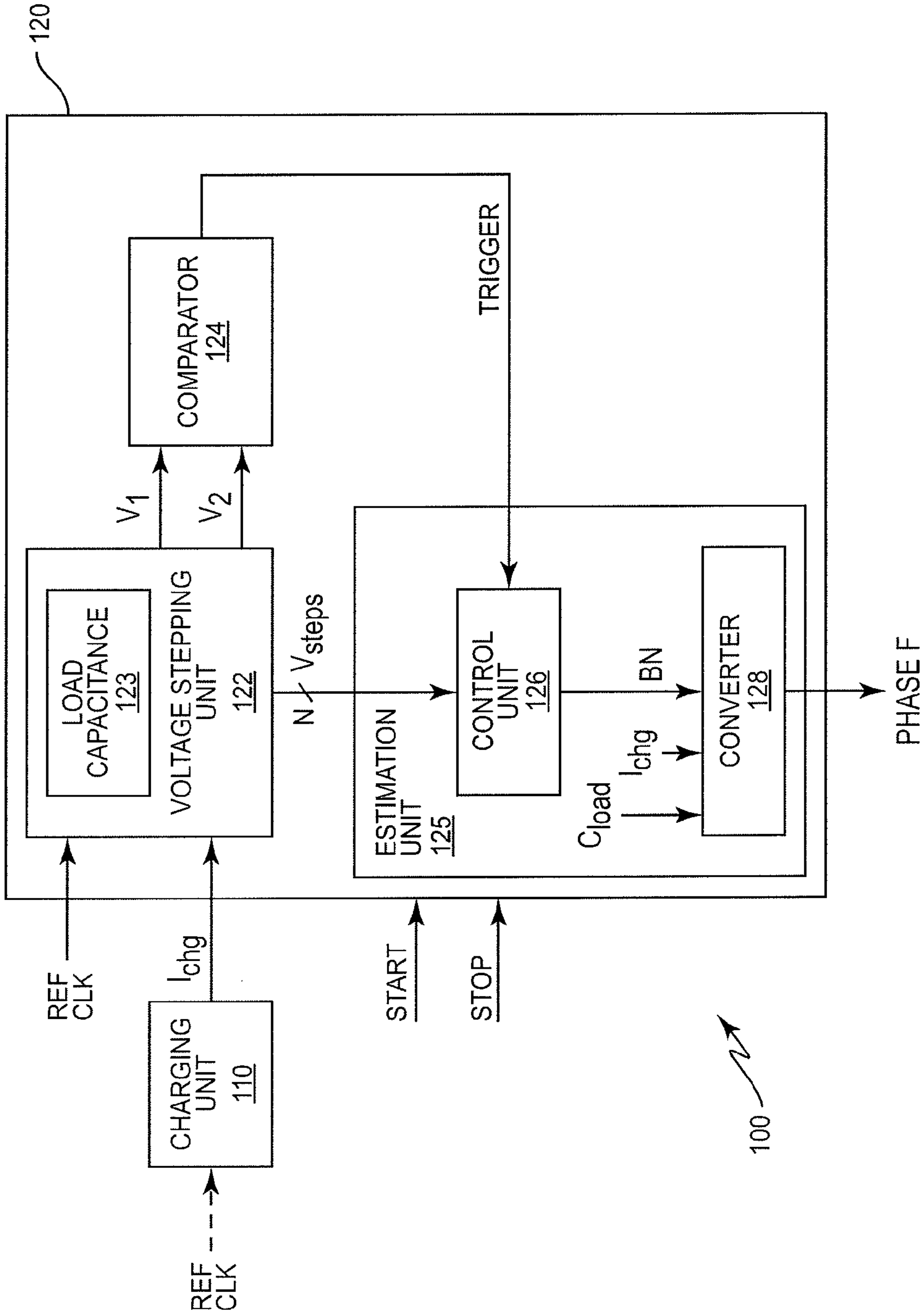
FIG. 2 depicts a block diagram of one exemplary charge-to-digital timer for the DPLL of FIG. 1.

The calibration method disclosed herein generally applies to digital phase-locked loops. FIG. 1 shows a block diagram of one exemplary DPLL 10 comprising a digital phase detector/filter 20, a digitally controlled oscillator (DCO) 30, and phase quantizer 40 comprising a counter 50 and the CDT 100 disclosed herein. Phase quantizer 40 quantizes the phase of the signal output by the DCO 30. To that end, counter 50 counts the integer number of DCO cycles to determine PhaseN, which represents an integer measurement of the instantaneous DCO phase, while CDT 100 determines PhaseF, which represents a fractional measurement of the instantaneous DCO phase, based on the elapsed time between start and stop signals applied to the CDT 100 (FIG. 2). Digital phase detector/filter 20 determines a phase error between the input frequency control word (FCW) and the quantized phase provided by the CDT 100, where the output phase error controls the DCO 320 to generate an output signal at a desired frequency. As disclosed further herein, calibrating the CDT 100 improves the performance of the DPLL 10 by improving the accuracy of the quantized phase output by the CDT 100.

Before discussing the calibration method, the following first discusses basic details of an exemplary charge-to-digital timer 100, depicted in FIG. 2, comprising a charging unit 110 and a measurement unit 120. Charging unit 110 outputs a known current $I_{chg}$ to the measurement unit 120 during a charge phase defined as the time between the start and stop signal. Measurement unit 120 measures the time between the start and stop signals during a measurement phase that begins after the stop signal is applied to the measurement unit 120 by first determining the fractional phase associated with the time difference between the start and stop signals and converting the determined phase to an estimated time difference. During closed-loop non-calibration operations, measurement unit 120 outputs the estimated time $T_{est}$. During calibration operations, measurement unit 120 outputs the fractional phase, PhaseF.

More particularly, measurement unit 120 comprises a voltage stepping unit 122, including a known capacitive load 123, a comparator 124, and an estimation unit 125 comprising a control unit 126 and a converter 128. Voltage stepping unit 122 outputs a ramping voltage $V_1$ and a fixed voltage $V_2$, where one of $V_1$ and $V_2$ is derived from a load voltage generated by the capacitive load 123 responsive to the charging current $I_{chg}$, and where the voltage stepping unit 122 ramps $V_1$ in a plurality of discrete voltage steps. Each discrete voltage step used to ramp $V_1$ is also output to the control unit 126. Comparator 124 outputs a trigger to the estimation unit 125 when a comparison between $V_1$ and $V_2$ satisfies a predetermined criteria. Responsive to the trigger, estimation unit 125 estimates the load voltage $V_{load,est}$ based on $V_2$ and a combination of the discrete voltage steps associated with the voltage stepping unit 122, and then outputs the fractional phase PhaseF, which is also denoted herein as PF, which represents a numerical estimate of the DCO clock phase. More particularly, control unit 126 samples the state of the buffer line associated with the voltage steps (see FIGS. 7 and 9), and outputs an index (BN) to the converter 128 representative of the combination of the discrete voltage steps. During calibration operations, converter 128 converts the format of the load voltage $V_{load,est}$ to generate PhaseF. When the time difference between the start and stop signals is unknown, e.g., during non-calibration closed-loop operations, converter 128 may determine an estimate of the elapsed time $T_{est}$ based on the capacitance of the capacitive load 123, the known current, and an estimated load voltage $V_{load,est}$ determined based on BN. However, when the time difference is known, e.g., as during calibration operations, $V_{load,est}$ directly depends on the phase because the sum of the discrete voltage steps should correspond to one oscillator cycle. The calibration operations disclosed herein adjust the capacitive load 123 and/or $I_{chg}$ so that the sum of the discrete voltage steps presents one oscillator cycle.

Co-pending and co-owned U.S. application Ser. No. 13/338,390 titled "Charge-to-Digital Timer," which is incorporated by reference herein, discloses additional details regarding the exemplary charge-to-digital timer 100 of FIG. 2, and particularly, the closed-loop operations of the charge-to-digital timer 100. It will be appreciated that the calibration method disclosed herein also applies to other charge-to-digital timers, and other time-to-digital converters.

Figure 3:
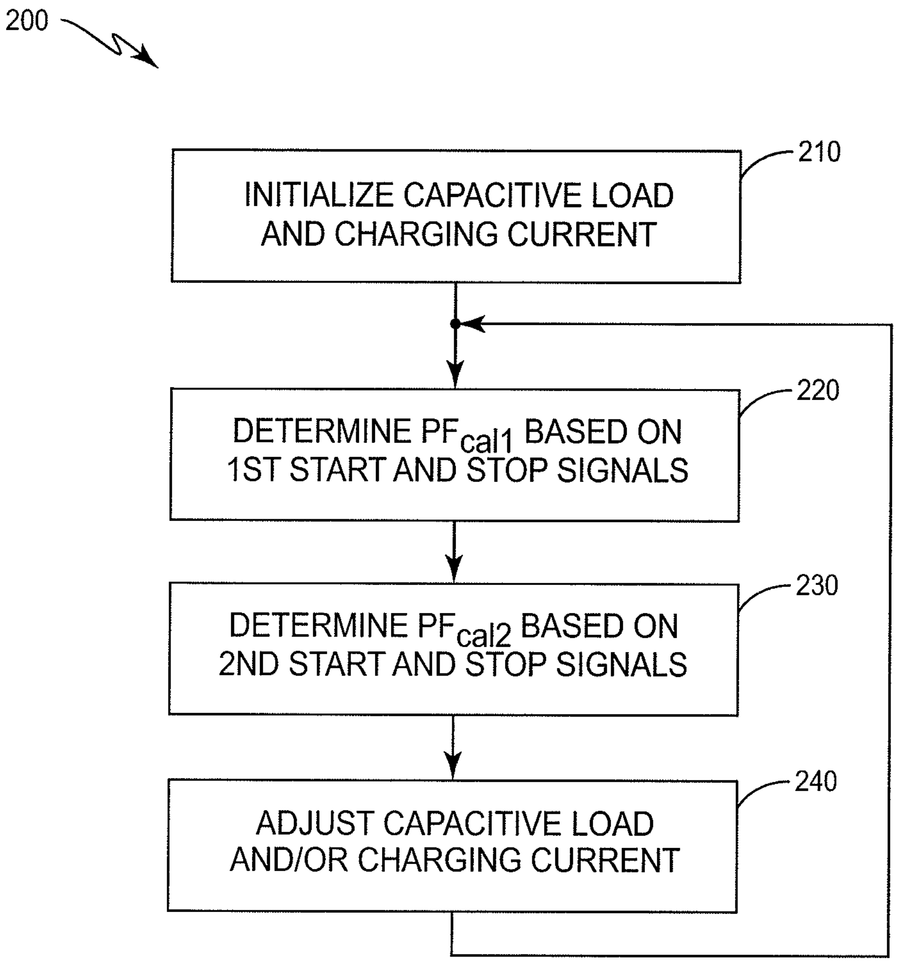
FIG. 3 depicts an exemplary calibration process for the charge-to-digital timer of FIG. 2.

FIG. 3 depicts one exemplary calibration method 200 for charge-to-digital timer 100. After initializing the capacitive load 123 and the charging current $I_{chg}$ (block 210), first start and stop signals are applied during a first calibration period to the measurement unit 120, which outputs a first calibration phase $PF_{cal1}$ based on the first start and stop signals as described above (block 220), where the first start and stop signals are separated in time by a first number of oscillator cycles. Further, the charge-to-digital timer 100 outputs a second calibration phase $PF_{cal2}$ based on second start and stop signals applied during a second calibration period to the measurement unit 120 as described above (block 230), where the second start and stop signals are separated in time by a second number of oscillator cycles having a known relationship to the first number of oscillator cycles. The capacitive load 123 and/or $I_{chg}$ are subsequently adjusted based on the first and second calibration phases (block 240). The calibration process (blocks 220-240) repeats as necessary. In some embodiments, the calibration process 200 occurs during open-loop operations of the charge-to-digital timer 100 independent of any closed-loop operations, e.g., responsive to a calibration command. Alternatively, calibration process 200 may continuously occur in parallel with the closed-loop operations.

Figure 4:
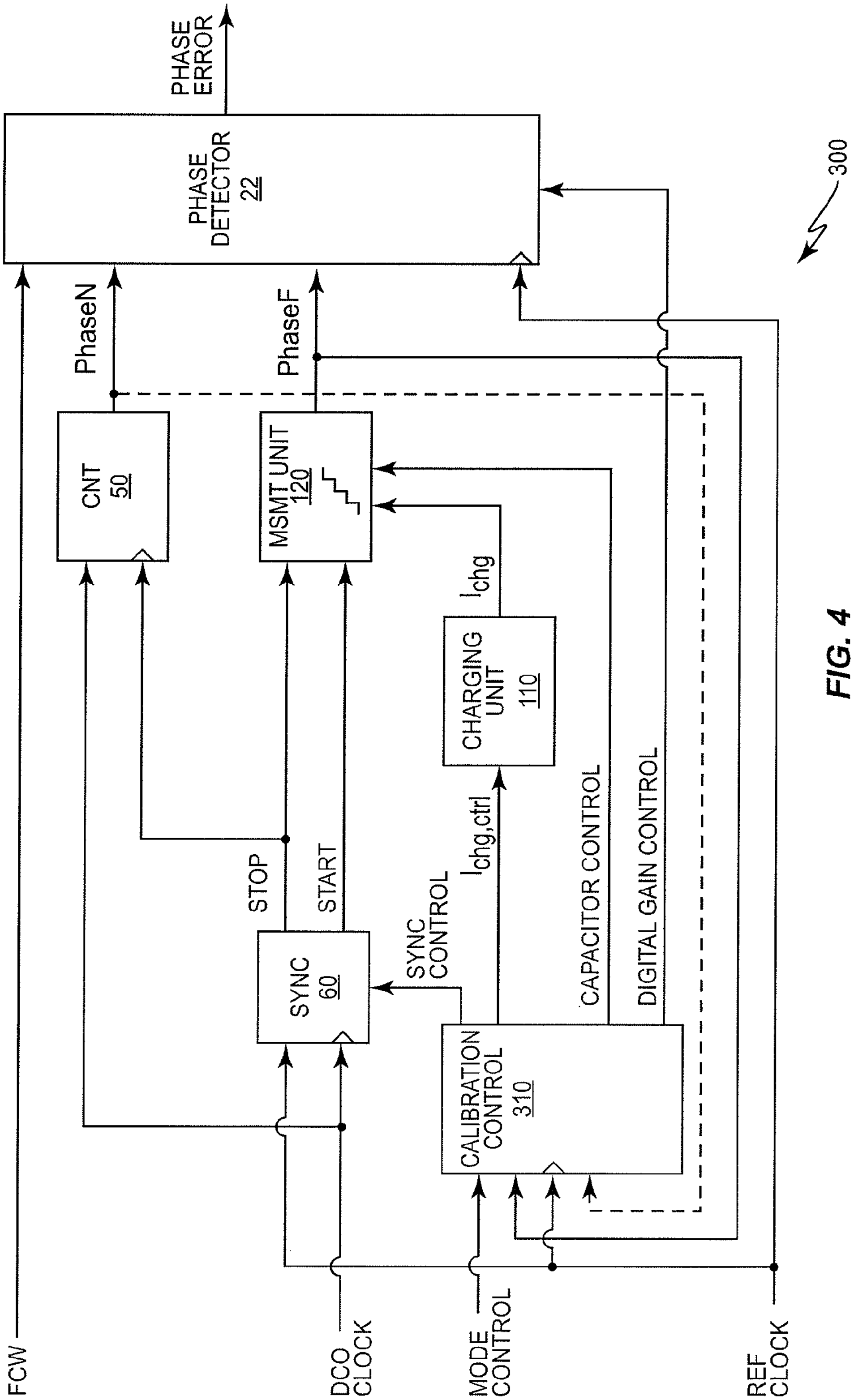
FIG. 4 depicts a block diagram of one exemplary calibration system for a charge-to-digital timer associated with a phase-locked loop.

FIG. 4 depicts a block diagram of a calibration system 300 that may be used to calibrate the charge-to-digital timer 100 according to the process 200 of FIG. 3. Calibration system 300 includes the charging unit 110 and measurement unit 120 of the charge-to-digital timer 100, a calibration controller 310, and a sync unit 60. When the charge-to-digital timer 100 is used for a PLL, the calibration system 300 also includes the counter 50 and phase detector 22 (which is included in the digital phase detector/filter 20 of FIG. 1). Sync unit 60 generates and synchronizes the start and stop signals with an oscillator clock (DCO clock) and a reference clock (REF clock) according to a sync control signal received from the calibration controller 310, where the number $N_{cyc}$ of oscillator cycles per REF clock may be determined based on the oscillator frequency $f_{DCO}$ and the REF clock frequency $f_{REF}$, e.g., according to:

$$N_{cyc} = \frac{f_{DCO}}{f_{REF}}. \tag{1}$$

Thus, a first number of oscillator cycles after the sync unit 60 applies a first start signal to the measurement unit 120, the sync unit 60 applies a first stop signal to the measurement unit 120. In response, the measurement unit 120 outputs a first fractional phase $PhaseF_1=PF_1$ representing a first fractional measurement of the instantaneous oscillator phase to the calibration controller 310. In some embodiments, a counter 50 may also determine the number of whole oscillator cycles between the start and stop signals to generate a first integer phase $PhaseN_1=PN_1$, which represents a first integer measurement of the instantaneous oscillator phase and is also reported to the calibration controller 310. For example, the counter 50 may count the integer number of oscillator cycles and sample the integer count to determine the first integer phase.

Subsequently, a second number of oscillator cycles after the sync unit 60 applies a second start signal to the measurement unit 120, the sync unit 60 applies a second stop signal to the measurement unit. In response, the measurement unit 120 outputs a second fractional phase $PhaseF_2=PF_2$ representing a second fractional measurement of the instantaneous oscillator phase to the calibration controller 310. In some embodiments, counter 50 may also count the number of whole oscillator cycles between the start and stop signals to generate a second integer phase $PhaseN_2=PN_2$, which represents a second integer measurement of the instantaneous oscillator phase and is also reported to the calibration controller 310. The time difference separating the first start and stop signals generally corresponds to a first number of whole oscillator cycles known to the calibration controller 310. Similarly, the time difference separating the second start and stop signals also generally corresponds to a second number of whole oscillator cycles known to the calibration controller 310. Further, the second number of whole oscillator cycles have a know relationship to the first number of whole oscillator cycles. For example, the first number of whole oscillator cycles may comprise m oscillator cycles, while the second number of whole oscillator cycles may comprise m+n oscillator cycles. Thus, in a perfectly calibrated system, the differences between the first and second fractional phases (and when used, the difference between the first and second integer phases) would be zero. However, when the differences are non-zero during calibration operations, the calibration controller 310 calibrates the charge-to-digital timer 100 based on the non-zero differences, e.g., by adjusting the load capacitance and/or the charging current of the charge-to-digital timer 100. For example, the calibration controller 310 may subtract $PhaseF_1$ and $PhaseF_2$ to determine an instantaneous fractional frequency, and subtract $PhaseN_1$ and $PhaseN_2$ to determine an instantaneous integer frequency, and subsequently adjust the capacitive load 123 and/or the charging current based on the integer and fractional frequencies.

Figure 5:
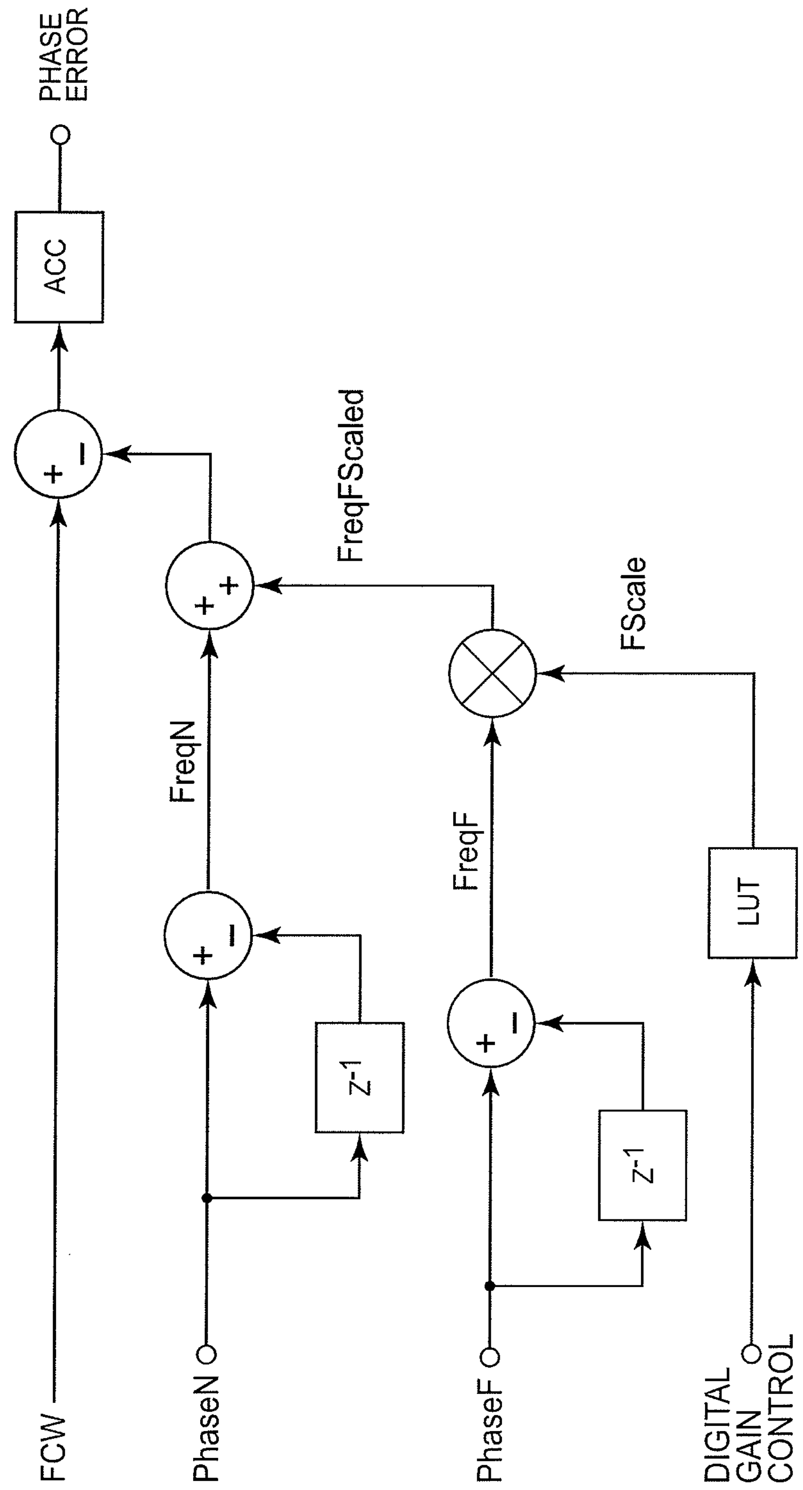
FIG. 5 depicts a block diagram of one exemplary phase detector for the calibration system of FIG. 4.

In some embodiments, e.g., those involving a digital PLL (DPLL), the calibration operations may further include optimizing the performance of the DPLL. In these embodiments, calibration controller 310 may also output a digital gain control signal to a phase detector 22 of the DPLL to control the quantization gain of the phase, as depicted in FIG. 4. The digital gain control signal may be used to generate a scaling factor applied to fractional phases determined during the closed-loop charge-to-digital timer operations (e.g., non-calibration operations used to measure unknown time differences). For example, the functionality of the phase detector 22 may be presented according to the following z-domain transfer function:

$$\phi(z) = FCW - ((1-z^{-1})PhaseN(z) + (1-z^{-1})F_{scale}PhaseF(z))\frac{(1+z^{-1})}{2(1-z^{-1})}, \tag{2}$$

where FCW represents a frequency control word for a digital reference frequency and $F_{scale}$ represents a scaling factor. The scaling factor, which may e.g., be retrieved from a look-up table responsive to the digital gain control signal scales one or more of the phases determined during closed-loop charge-to-digital timer operations, as depicted in FIG. 5. In FIG. 5, the blocks represent a unit delay of one REF clock cycle, the LUT block represents the look-up table of scaling factors, FreqN represents an integer frequency derived from consecutive PhaseN values, FreqF represents an instantaneous fractional frequency derived from consecutive PhaseF, and ACC represents an accumulator for converting a measured frequency to a PLL phase.

Figure 6:
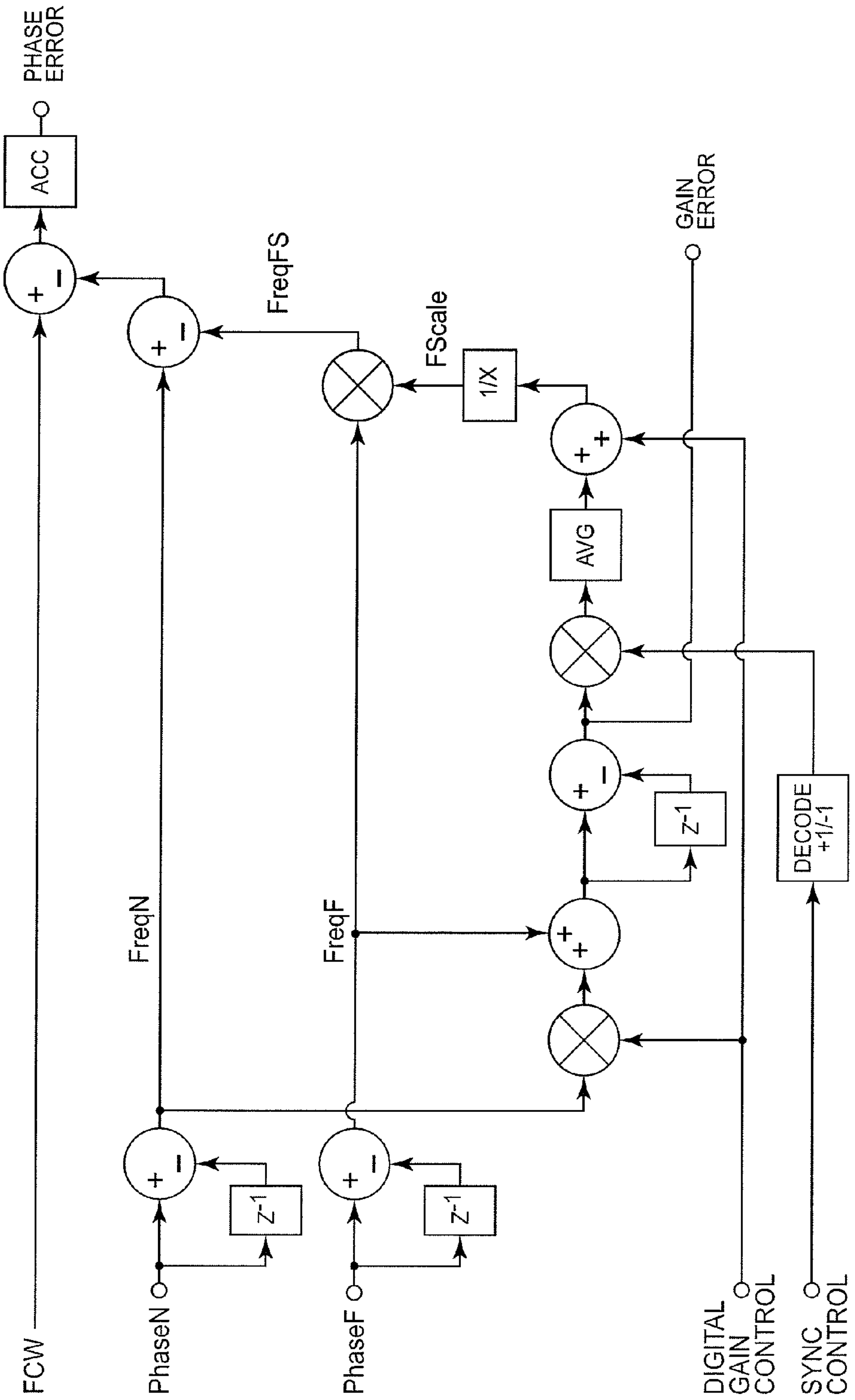
FIG. 6 depicts a block diagram of another exemplary phase detector for the calibration system of FIG. 4.

FIG. 6 shows an alternative structure for determining $F_{scale}$ responsive to the digital gain control signal, where $F_{scale}$ is calculated based on FreqN, FreqF, the gain control signal, the sync control signal, and various mathematical operations. In FIG. 6, the $z^{-1}$ blocks represent a unit delay of one REF clock cycle, FreqN represents an integer frequency derived from consecutive PhaseN values, FreqF represents an instantaneous fractional frequency derived from consecutive PhaseF, and ACC represents an accumulator for converting a measured frequency to a PLL phase.

Now that the general calibration operations and apparatus have been described, the following describes more specific calibration details as they may apply to specific charge-to-digital timers 100. In particular, the following describes two separate charge-to-digital timers 100 (FIGS. 7 and 9) and details of the corresponding adjustment process 240 of the general calibration process 200 (FIGS. 8 and 10). While the details of each calibration process are explained relative to a corresponding charge-to-digital timer 100, it will be appreciated that it would be straight forward for the skilled user to modify either exemplary adjustment process 240 for application to either of the exemplary charge-to-digital timers 100 and/or other similar charge-to-digital timers 100.

Figure 7:
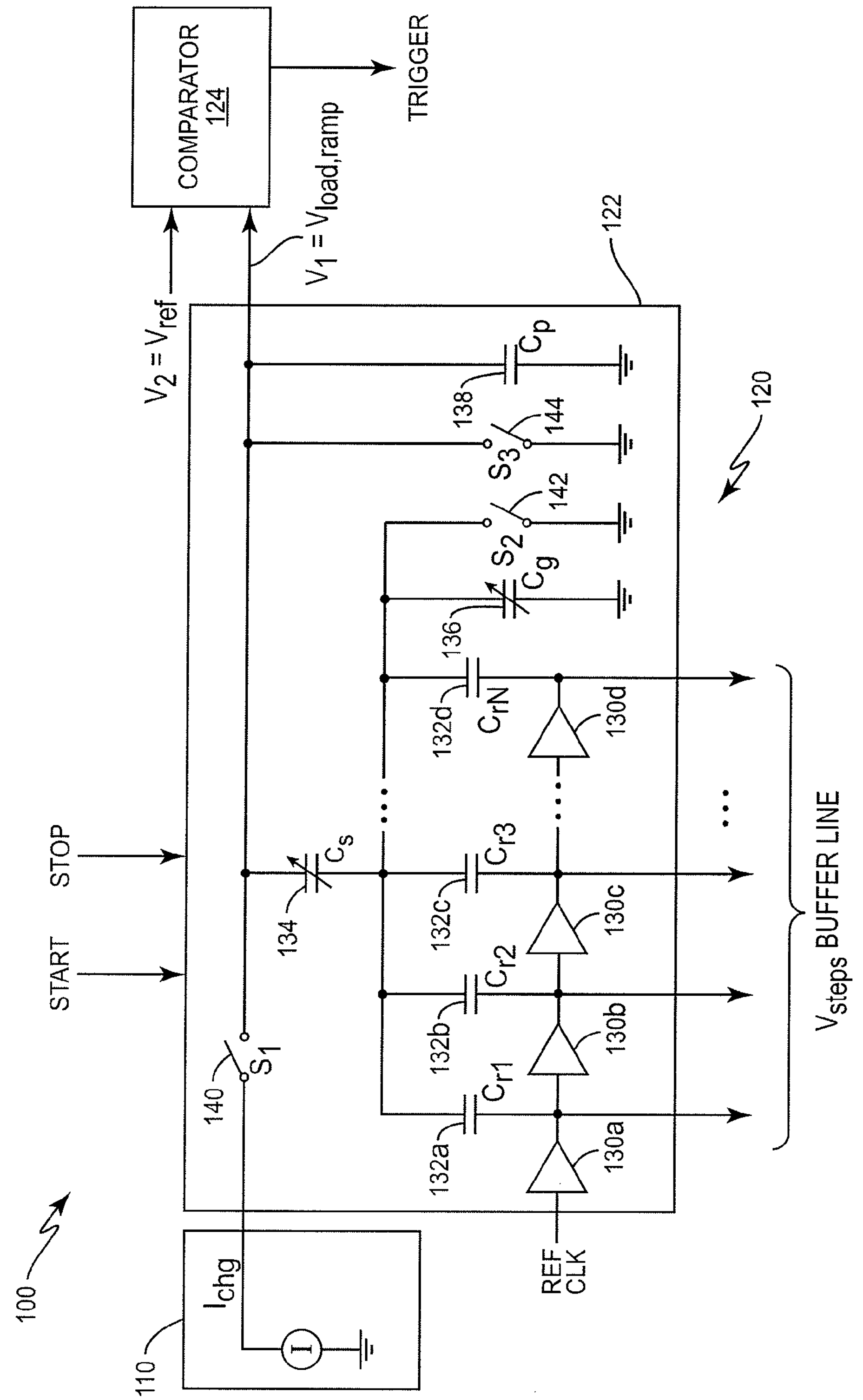
FIG. 7 depicts a circuit diagram for an exemplary charge-to-digital timer.
Figure 8:
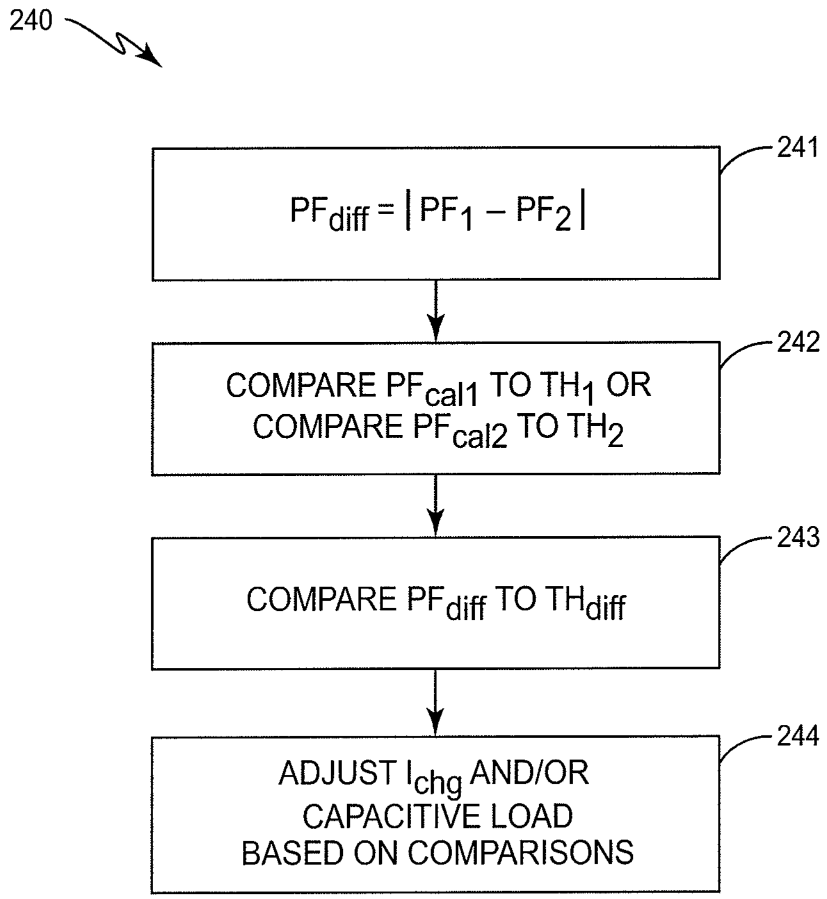
FIG. 8 depicts an exemplary adjustment process for the calibration process of FIG. 3.
Figure 9:
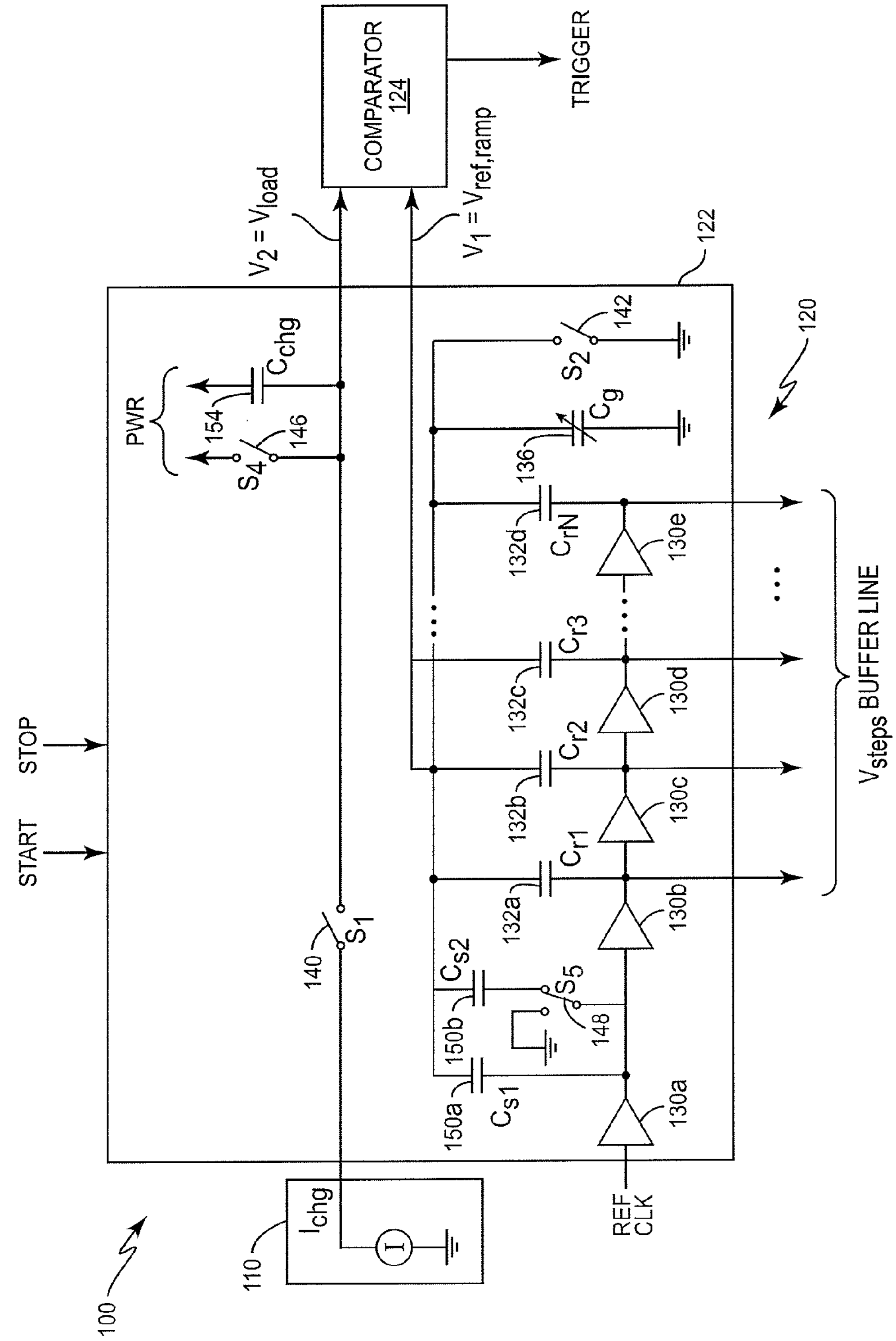
FIG. 9 depicts a circuit diagram for another exemplary charge-to-digital timer.
Figure 10:
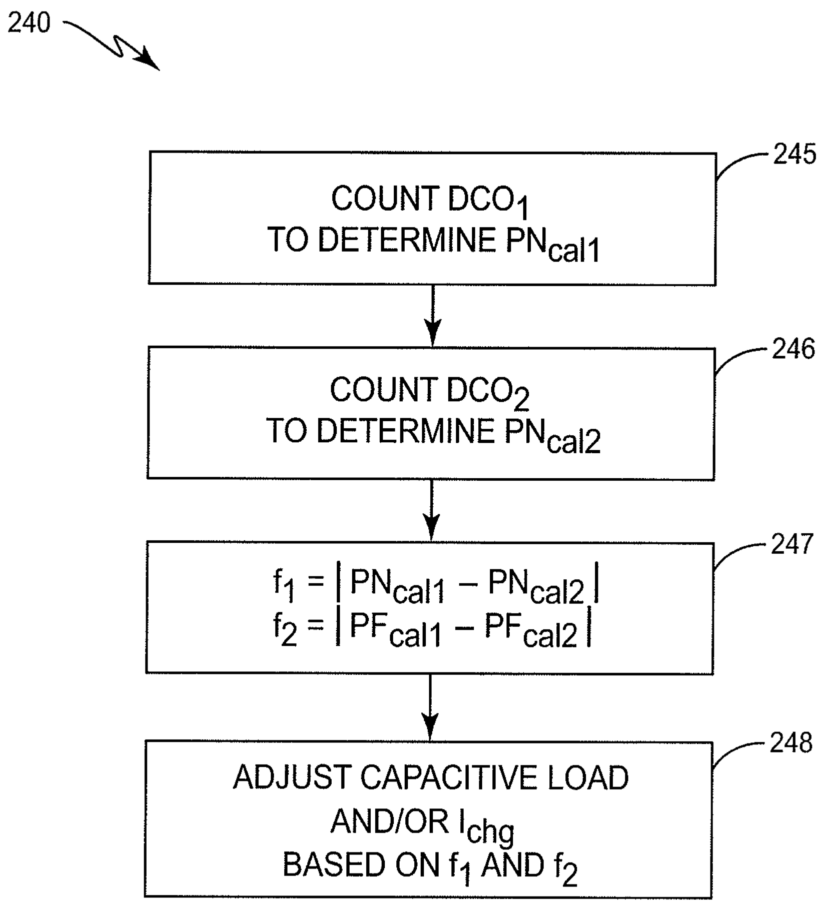
FIG. 10 depicts another exemplary adjustment process for the calibration process of FIG. 3.

FIGS. 7 and 9 depict exemplary charge-to-digital timers 100, while FIGS. 8 and 10 respectively depict the corresponding adjustment process 240. The timers 100 in FIGS. 7 and 9 both comprise a charging unit 110 with a current source to generate the charge current $I_{chg}$, and a voltage stepping unit 122 that receives $I_{chg}$ during a charge phase and outputs $V_1$ and $V_2$ to the comparator 124 during a measurement phase. The differences between the timers 100 of FIGS. 7 and 9 lie in the configuration of the voltage stepping unit 122. Thus, the following focuses on the specific implementations of the voltage stepping units 122, followed by details of the corresponding adjustment process 240.

During closed-loop operations, where the charge-to-digital timer 100 measures the unknown time between the start and stop signals, the voltage stepping unit 122 of FIG. 7 sets $V_1$ equal to $V_{load}$ and step-wise ramps $V_{load}$ for comparison relative to a fixed reference voltage $V_2=V_{ref}$. In this embodiment, a first input of comparator 124 receives $V_2$ from an external source, e.g., an external controller, and a second input of the comparator 124 receives $V_1$ from the voltage stepping unit 122.

In FIG. 7, the voltage stepping unit 122 comprises a plurality of serially connected buffers 130, a first switch $S_1$ 140, a second switch $S_2$ 142, a third switch $S_3$ 144, a variable scale capacitor $C_s$ 134, a variable gain capacitor $C_g$ 136, a parasitic capacitance $C_p$ 138, and a plurality of ramp capacitors $C_r$ 132, where the charging unit 110 charges $C_p$, $C_s$, $C_g$, and the ramp capacitors during the charge phase to generate the charged capacitive load 123. Scale capacitor $C_s$ 134 operatively connects at a first node to the output of the charging unit 110 and the second input of the comparator 124, and at a second node to a common node of the ramp capacitors 132. Gain capacitor $C_g$ 136 connects between the second node of $C_s$ 134 and ground, while the parasitic capacitance 138 is modeled as being connected between the second input of the comparator 124 and ground. The buffers 130 couple to the ramp capacitors 132 of the capacitive load 123, where each buffer 130 is configured to delay a reference clock by a predetermined delay, and where the voltage stepping unit 122 ramps $V_1=V_{load}$ responsive to the delayed reference clock sequentially output by the buffers 130. More specifically, each buffer 130 comprises a digital buffer that functionally implements a switching function to switch the buffer output from a first fixed voltage, e.g., 0 V, to second fixed voltage, e.g., $V_{dd}$, during the ramping of the measurement phase when the reference clock passes through the buffer chain. As such, a charge is injected into the capacitive network formed by the N ramp capacitors $C_r$ 132 and the gain capacitor $C_g$ 136 as the reference clock passes through the buffer chain, where the step height of each voltage step depends on $V_{dd}$ and the capacitance ratio $C_{ri}/C_{tot}$, where $C_{tot}$ represents the total capacitance seen from the comparator input to ground, i represents the buffer stage, and represents the unit capacitance for the $i^{th}$ buffer stage, and where $C_{tot}$ may be defined according to:

$$C_{tot} = NC_{ri} + C_g + \frac{C_s C_p}{C_s + C_p}. \tag{3}$$

For example, when buffer 130*c* (buffer stage i=3) drives charge through $C_{r3}$ to the capacitive network having a total capacitance of $C_{tot}$ the total capacitance $C_{tot}$ in this case is formed by $C_g$ in parallel with the series connection of $C_s$ and $C_p$ and in parallel with $C_r$, $C_{r2}$, and $C_{r3}$. In this case, the voltage step depends on $V_{dd}$ and $C_{r3}/C_{tot}$.

The first switch $S_1$ 140 connects between the output of the charging unit 110 and the first node of $C_s$ 134. The second switch $S_2$ 142 connects in parallel with $C_g$ 136, and the third switch $S_3$ 144 connects in parallel with $C_p$ 138. During the charge phase, $S_1$ 140 is actuated to a closed position while $S_2$ and $S_3$ 142, 144 are maintained in an open position to enable the capacitive load 123 to charge responsive to $I_{chg}$, where the charged capacitive load 123 may be defined by:

$$C_{chg} = C_p + \left(\frac{1}{C_s} + \frac{1}{C_g + NC_{ri}}\right)^{-1} \tag{4}$$

During the measurement phase, $S_1$ 140 is actuated to the open position to disconnect the charge unit 110 from the voltage stepping unit 122, while $S_2$ and $S_3$ 142, 144 remain in the open position. During a discharge phase, which occurs after the comparator 124 outputs the trigger or charge-to-digital timer 100 outputs PF, $S_1$ 140 remains in the open position, while $S_2$ and $S_3$ 142, 144 are actuated to the closed position to enable the capacitive load 123 to discharge to ground.

Capacitive load 123 comprises a variable scale capacitor $C_s$ 134, a variable gain capacitor $C_g$ 136, a parasitic capacitance $C_p$ 138, and a plurality of ramp capacitors $C_r$ 132. The buffers 130 couple to the ramp capacitors 132 of the capacitive load 123, where each buffer 130 is configured to delay a reference clock by a predetermined delay, and where the voltage stepping unit 122 ramps $V_1=V_{load}$ responsive to the delayed reference clock sequentially output by the buffers 130.

During the measurement phase, the delayed reference clock applied by one of the buffers 130 to the corresponding ramp capacitor $C_r$ 132 ramps $V_1=V_{load}$ by an amount stored in the corresponding ramp capacitor $C_r$ 132. For example, after the first buffer 130*a* applies a first delay to the reference clock, the initial value of $V_{load}$ ramps, e.g., increases, by a first voltage step stored in the first ramp capacitor $C_{r1}$ 132*a*, and the voltage stepping unit 122 outputs the first voltage step to the controller 126. Comparator 124 compares the ramped $V_{load}$ voltage ($V_1=V_{load,ramp}$) and $V_2=V_{ref}$. Such ramping and comparison operations continue until the comparison between the ramping load voltage and the fixed reference voltage in the comparator 124 satisfies a predetermined condition, e.g., $V_1 \geq V_2$.

FIG. 8 depicts an adjustment process 240 for the exemplary calibration process 200 of FIG. 3 for the charge-to-digital timer 100 of FIG. 7, where in this example, the calibration process 200 and adjustment process 240 occurs during open-loop operations of the charge-to-digital timer 100 independent of the normal closed-loop timer operations. After determining the first and second calibration phase $PF_1$, $PF_2$ in blocks 220 and 230 as described above with reference to FIG. 3, the calibration controller 310 subtracts the first and second calibration phases to determine a phase difference $PF_{diff}$ (block 241). Further, calibration controller 310 either compares $PF_1$ to a first threshold $TH_1$, or compares $PF_2$ to a second threshold $TH_2$ (block 242), and compares $PF_{diff}$ to a difference threshold $TH_{diff}$ (block 243). Based on the comparisons, calibration controller 310 adjusts at least one of the capacitive load and $I_{chg}$ (block 244). In one embodiment, the calibration controller 310 may adjust $C_s$ based on the comparison between $PF_1$ and $TH_1$, or between $PF_{cal2}$ and $TH_2$, and may adjust $C_g$ or $I_{chg}$ based on the comparison between $PF_{diff}$ and $TH_{diff}$. For example, if $PF_1>TH_1$, or if $PF_2>TH_2$, the calibration controller may reduce the capacitance of $C_s$ to increase the voltage rise time constant. Further, if $PF_{diff}>TH_{diff}$, the calibration controller 310 may reduce the capacitance of $C_g$ to increase $V_{step}$, while if $PF_{diff}<TH_{diff}$ the calibration controller 310 may increase the capacitance of $C_g$ to decrease $V_{step}$.

FIG. 9 depicts an alternative charge-to-digital timer 100, and FIG. 10 depicts an alternate adjustment process 240 that occurs parallel with the normal closed-loop charge-to-digital timer operations. Contrastingly to the embodiment of FIG. 7, where $V_1=V_{load}$ and $V_2=V_{ref}$, the voltage stepping unit 122 of FIG. 9 step-wise ramps $V_1=V_{ref}$ for comparison relative to $V_2=V_{load}$. In this embodiment, the voltage stepping unit 122 provides both $V_1$ and $V_2$ to respective first and second inputs of the comparator 124.

The voltage stepping unit 122 comprises a plurality of serially connected buffers 130, a first switch $S_1$ 140, a second switch $S_2$ 142, a third switch $S_4$ 146, a fourth switch $S_5$ 148, a variable gain capacitor $C_g$ 136, a charge capacitor $C_{chg}$ 152, a plurality of ramp capacitors $C_r$ 132, and first and second scale capacitors $C_{s1}$ 150*a* and $C_{s2}$ 150*b*. In this case, the charging unit 110 charges only $C_{chg}$, which represents the capacitive load 123 in this embodiment, during the charge phase. The voltage over the capacitive load 123 still changes during the charge phase responsive to $I_{chg}$, where the charge time changes between consecutive reference cycles, e.g., by one DCO cycle. The changing charge times gives a difference in charged voltage, which equals to one DCO cycle in time. Scale capacitors $C_{s1}$ 150*a* and $C_{s2}$ 150*b* operatively connect between a common node of the N ramp capacitors $C_r$ 132 and an input to the buffers 130, where the fourth switch $S_5$ 148 selectively connects the second scale capacitor $C_{s2}$ 150*b* to the input to the buffers 130 or to ground. In one embodiment, the first and second scale capacitors $C_{s1}$ 150*a* and $C_{s2}$ 150*b* are sized to match the amount of charge difference applied to the charge capacitor $C_{chg}$ 152 during the charge phase between consecutive reference clock cycles. Gain capacitor $C_g$ 136 connects between the second input of the comparator 124 and ground, while $C_{chg}$ 152 connects between the first input of the comparator 124 and a power supply. While not explicitly shown, it will be appreciated that $C_h$, may be tunable. The buffers 130 couple to the ramp capacitors 132, where each buffer 130 is configured to delay a reference clock by a predetermined delay, and where the voltage stepping unit 122 ramps $V_1=V_{ref}$ responsive to the delayed reference clock sequentially output by the buffers 130. More specifically, each buffer 130 comprises a digital buffer that functionally implements a switching function to switch the buffer output from a first fixed voltage, e.g., 0 V, to a second fixed voltage, e.g., $V_{dd}$, during the ramping of the measurement phase when the reference clock passes through the buffer chain. As such, a charge is injected into the capacitive network formed by the ramp capacitors $C_r$ 132, the gain capacitor $C_g$ 136, and the first scale capacitor $C_{s1}$ 150*a* as the reference clock passes through the buffer chain. During alternating reference clock cycles, the fourth switch closes causing the capacitive network to further include the second scale capacitor $C_{s2}$ 150*b*. The step height of each voltage step during the measurement phase depends on $V_{dd}$ and the capacitance ratio $C_{ri}/C_{tot}$, where $C_{tot}$ represents the total capacitance seen from the comparator input to ground, i represents the buffer stage, and $C_{ri}$ represents the unit capacitance for the $i^{th}$ buffer stage. During alternating reference clock cycles, $C_r$, may alternatingly be determined according to:

$$C_{r1}=C_{s1} \text{ (during, e.g., odd clock cycles)} \quad (5)$$

$$C_{r1}=C_{s1}+C_{s2} \text{ (during, e.g., even clock cycles)} \quad (6)$$

The total capacitance $C_{tot}$ may thus be determined for all reference clock cycles according to:

$$C_{tot}=NC_{ri}+C_g+C_{s1}+C_{s2}. \quad (7)$$

In the embodiment of FIG. 9, for example, the voltage stepping unit 122 ramps $V_1=V_{ref}$ down during the measurement phase.

First switch $S_1$ 140 connects between the output of the charging unit 110 and the first input of the comparator 124, while second switch $S_2$ 142 connects in parallel with $C_g$ 136 and third switch $S_4$ 146 connects in parallel with $C_{chg}$ 152. During the charge phase, $S_1$ 140 is actuated to the closed position while $S_2$ and $S_4$ 142, 146 are maintained in the open position to enable the capacitive load 123 to charge responsive to $I_{chg}$. During the measurement phase, $S_1$ 140 is opened to disconnect the charge unit 110 from the voltage stepping unit 122, while $S_2$ and $S_4$ 142, 146 remain in the open position. It will be appreciated that $S_5$ may start the measurement phase in either the position connecting $C_{s2}$ to ground or $C_{s2}$ to a first buffer 130*a* output, and thereafter alternatingly changing the position responsive to alternating reference clock cycles. During a discharge phase, which occurs after comparator 124 outputs the trigger or charge-to-digital timer 100 outputs PF, $S_1$ 140 is opened, while $S_2$ and $S_4$ 142, 146 are actuated to the closed position to enable the capacitive load 123, e.g., $C_{chg}$, and the remaining capacitors in the voltage stepping unit 122 to discharge to ground.

During the measurement phase, the delayed reference clock applied by one of the buffers 130 to the corresponding ramp capacitor $C_r$ 132 ramps $V_1=V_{ref}$ by an amount stored in the corresponding ramp capacitor $C_r$ 132. For example, after the first buffer 130*a* applies a first delay to the reference clock, the initial value of $V_{ref}$ ramps, e.g., increases, by a first voltage step stored in the first ramp capacitor $C_{r1}$ 132*a*, and the voltage stepping unit 122 outputs the first voltage step to the controller 126. Comparator 124 compares the ramped $V_1=V_{ref}$ and $V_2=V_{load}$. Such ramping and comparison operations continue until the comparison between the ramping reference voltage and the fixed load voltage in the comparator 124 satisfies a predetermined condition, e.g., $V_1 \geq V_2$.

The adjustment process 240 of FIG. 8 may be applied to the charge-to-digital timer 100 of FIG. 9. In this case, for example, the calibration controller 310 may adjust $C_g$ based on the comparison between $PF_1$ and $TH_1$ or the comparison between $PF_2$ and $TH_2$, and may adjust $C_{chg}$ or $I_{chg}$ based on the comparison between $PF_{diff}$ and $TH_{diff}$.

Alternatively, the adjustment process 240 of FIG. 10 may be used with the charge-to-digital timer 100 of FIG. 9, where in this case, the calibration operations continuously occur in parallel with the normal closed-loop charge-to-digital timer operations. The adjustment process 240 comprises counting the integer number of oscillator cycles DCO, between the first start and stop signals to determine a first integer phase $PN_1$ (block 245), and counting the integer number of oscillator cycles $DCO_2$ between the second start and stop signals to determine a second integer phase $PN_2$ (block 246). Subsequently, a first instantaneous frequency $f_1$ is determined based on a difference between the first and second integer phases, and a second instantaneous frequency $f_2$ is determined based on a difference between the first and second fractional phases (block 247). The calibration controller 310 adjusts at least one of the capacitive load 123 and the charging current based on $f_1$ and $f_2$ (block 248). For example, the calibration controller 310 may adjust at least one of $C_g$ and $I_{chg}$ based on $f_1$ and $f_2$. It will be appreciated that the adjustment process/step 240 of FIG. 10 may also be applied to the charge-to-digital 100 of FIG. 7. In this case, the calibration controller 310 may adjust at least one of $C_g$, $C_s$, and $I_{chg}$ based on $f_1$ and $f_2$.

As depicted in FIGS. 5 and 6, an exemplary phase detector 22 of DPLL may scale PF and/or PN during closed-loop operations based on a scaling factor Fscale. To ensure optimal performance by the DPLL, the calibration controller 310 may also estimate Fscale during the calibration process based on $f_2$, where the calibration controller 310 applies the estimated scaling factor to the fractional phases determined during the closed-loop operations (independently from the calibration operations). It will be appreciated that when the calibration process associated with FIG. 8 is used, the scaling factor is determined during the open-loop calibration operations, and is applied during the closed-loop non-calibration operations. When the calibration process associated with FIG. 10 is used, the scaling factor is determined during the closed-loop calibration operations, and is applied during the closed-loop non-calibration operations.

In some embodiments, the first and second calibration periods comprise consecutive calibration periods, such that the second start and stop signals of the second calibration period are applied to the charge-to-digital timer after the first start and stop signals of the first calibration period are applied to the charge-to-digital timer. In this case, the first and second calibration phases are determined during the first and second calibration periods and are stored, e.g., in memory, and the calibration controller 310 implements the calibration process based on the stored first and second calibration phases.

For this example, the adjustment process 240 of FIGS. 8 and 10 may be more directly applied to the charge-to-digital timer 100 of FIG. 7 according to the following detailed steps:

1. Initialize $C_s$ and $C_g$.
2. Open $S_1$, and close $S_2$ and $S_3$ at the falling edge of REF clock.
3. Close $S_1$ and open $S_2$ and $S_3$ at the rising REF clock.
   After n oscillator cycles (e.g., n=2), open $S_1$ ($S_2$ and $S_3$ remain open)
   Save first calibration phase $PF_{cal1}$.

Figure 11A:
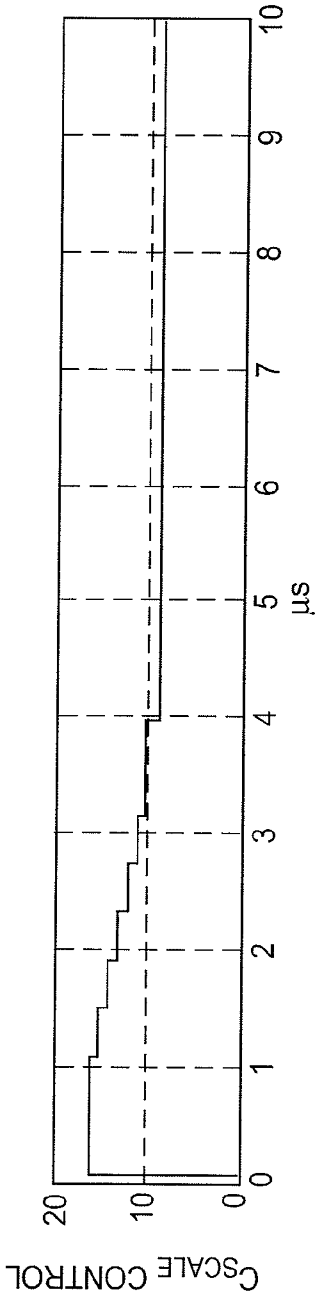
FIGS. 11A-11C depict simulated calibration results using the calibration process disclosed herein.
Figure 11B:
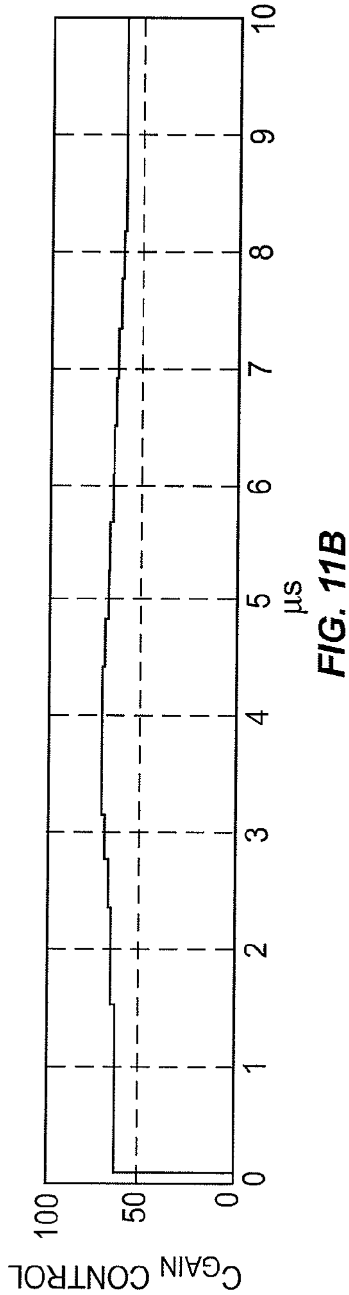
Figure 11C:
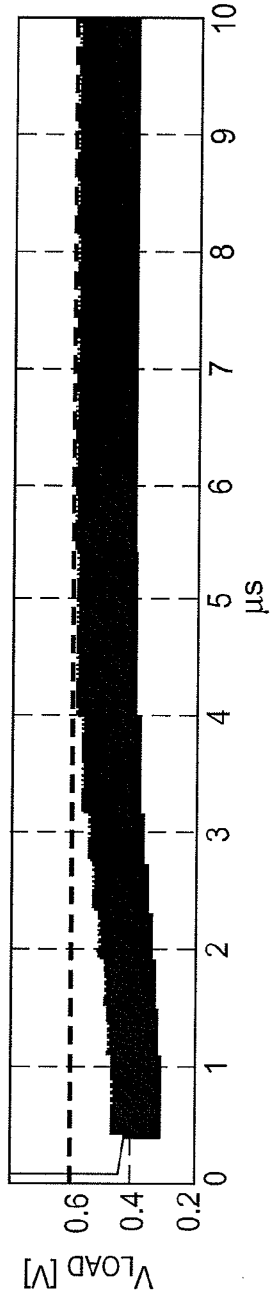

4. Close $S_2$ and $S_3$ at the falling edge of the REF clock (to reset the voltage).
5. Close $S_1$ and open $S_2$ and $S_3$ at the rising REF clock. After m oscillator cycles (e.g., m=3), open $S_1$ ($S_2$ and $S_3$ remain open). Save second calibration phase $PF_{cal2}$.
6. Close $S_2$ and $S_3$ at the falling edge of the REF clock (to reset the voltage).
7. Compare $PF_{cal1}$ or $PF_{cal2}$ to a threshold (e.g., $TH_1$ or $TH_2$). Adjust $C_s$ based on the comparison.
8. Compare the difference between $PF_{cal1}$ and $PF_{cal2}$ to a threshold (e.g., $TH_{diff}$). Adjust $C_g$ based on the comparison
9. Repeat steps 3-8 for the duration or a calibration time. The calibration time may be predefined as a fixed number of reference frequency clock cycles. Alternatively, the calibration time may comprise a variable time defined as the time required to stabilize $C_s$ and/or $C_g$, e.g., 5 μs for $C_s$ and 8 μs for $C_g$, as depicted in FIG. 11.
10. The calibration controller 310 may use the difference value determined in step 8 to estimate a scaling factor Fscale for scaling the PhaseF measurement obtained during closed-loop operations. For example, Fscale is inversely proportional to the difference value determined in step 8.

The same details may be applied to the charge-to-digital timer of FIG. 9, where the steps specific to $C_s$ are applied to $C_{chg}$ or $I_{chg}$, and the steps applied to $S_3$ are instead applied to $S_4$. In this example, one open-loop embodiment closes $S_5$ 148 at all times to keep $C_{32}$ connected to ground at all times, while another open-loop embodiment implements open-loop calibration operations for both positions of $S_5$ 148, which is more complex and time consuming.

In other embodiments, a measurement control loop runs in parallel with a calculation loop to determine the first and second calibration phases to implement a calibration process based on multiple first and second calibration phases. For example, the first start and stop signals of the first calibration period followed by the second start and stop signals of the second calibration period are repeatedly applied during the measurement control loop, which comprises a plurality of consecutive first and second calibration periods. One or more first and second calibration phases are determined for one or more of the corresponding first and second calibration periods during the calculation loop, which runs in parallel with the measurement control loop. In this case, the calibration controller 310 tracks the first calibration phases determined during the calculation loop to determine a minimum calibration phase, and tracks the second calibration phases during the calculation loop to determine a maximum calibration phase. The calibration controller 310 then compares the minimum calibration phase to a minimum threshold, e.g., $TH_1$, or compares the maximum calibration phase to a maximum threshold, e.g., $TH_2$, and determines the calibration difference $PF_{diff}$ by subtracting the minimum and maximum calibration phases.

For this example, the adjustment process 240 of FIGS. 8 and 10 may be more directly applied to the charge-to-digital timer 100 of FIG. 7 according to the following detailed steps:

Measurement Control Loop:

1. Open $S_1$ and close $S_2$ and $S_3$ at the falling edge of the REF clock.
2. Close $S_1$ and open $S_2$ and $S_3$ at the rising edge of the REF clock. After n oscillator cycles (e.g., n=2), open $S_1$ ($S_2$ and $S_3$ remain open)
3. Close $S_2$ and $S_3$ at the falling edge of the REF clock (to reset the voltage).
4. Close $S_1$ and open $S_2$ and $S_3$ at the rising edge of the REF clock. After m oscillator cycles (e.g., m=3), open $S_1$ ($S_2$ and $S_3$ remain open).
5. Close $S_2$ and $S_3$ at the falling edge of the REF clock (to reset the voltage).
6. Repeat steps 2-5 until calculation loop is ready.

Calculation Loop:

1. Initialize $C_s$ and $C_g$.
2. Wait j REF clock cycles to enable charge-to-digital measurements to stabilize.
3. Track minimum and maximum calibration phases for k REF clock cycles.
4. Compare the maximum or minimum calibration phase to a threshold (e.g., $TH_1$ or $TH_2$). Adjust $C_s$ based on the comparison.
5. Compare the difference between the maximum and minimum calibration phases to a threshold (e.g., $TH_{diff}$). Adjust $C_g$ based on the comparison
6. Repeat steps 2-5 of the calibration loop until $C_s$ and $C_g$ stabilize.
7. The calibration controller 310 may use the difference value to estimate a scaling factor Fscale for scaling the PhaseF measurement during closed-loop operations. For example, Fscale is inversely proportional to the difference value determined.

The same details may be applied to the charge-to-digital timer of FIG. 9, where the steps specific to $C_s$ are applied to $C_{chg}$ or $I_{chg}$, and the steps applied to $S_3$ are instead applied to $S_4$. In this example, one open-loop embodiment closes $S_5$ 148 at all times to keep $C_{s2}$ connected to ground at all times, while another open-loop embodiment implements open-loop calibration operations for both positions of $S_5$ 148, which is more complex and time consuming.

Figure 12A:
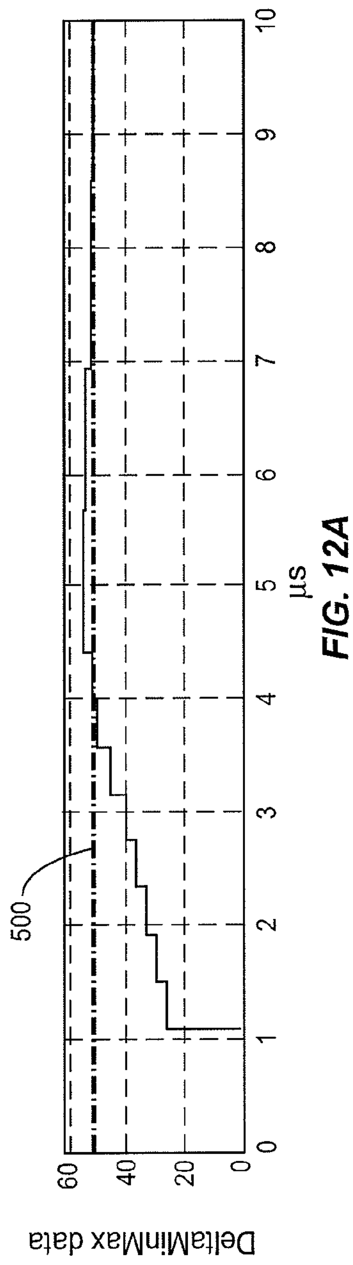
FIGS. 12A-12C depict measurement values for the exemplary adjustment process of FIG. 10.
Figure 12B:
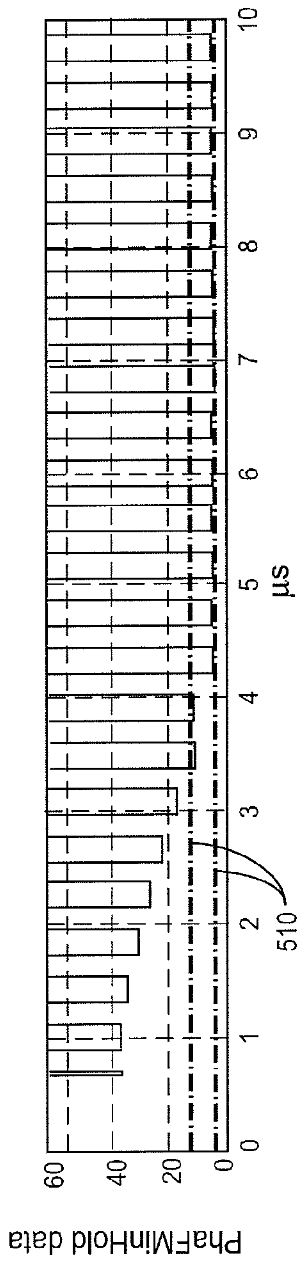
Figure 12C:
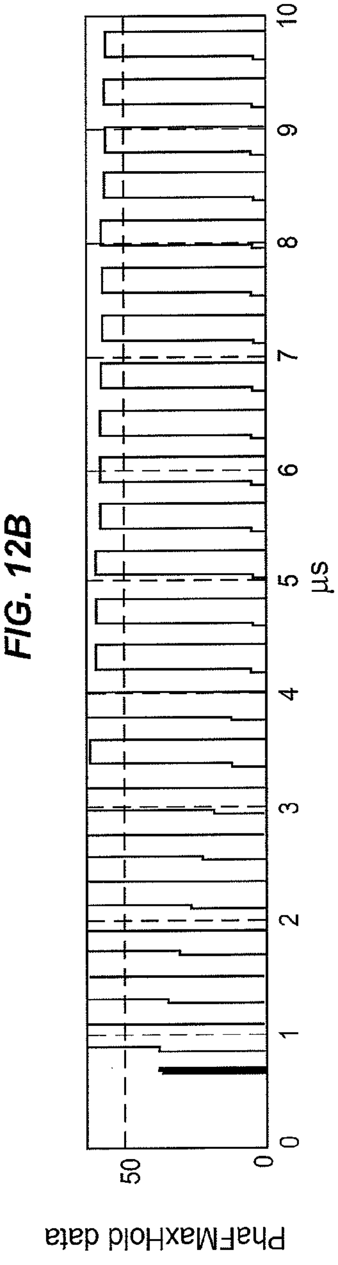

FIG. 12 depicts exemplary signals for the maximum and minimum calibration phases, and the corresponding difference between the maximum and minimum calibration phases. The measurement control loop may run for some predetermined time before the calculation loop begins running in parallel with the measurement control loop. For example, the measurement control loop may start running at t≈0.1 μs, and the calculation loop may start running at t≈1 μs, as depicted in FIG. 12. Lines 500 and 510 in FIGS. 12(*a*) and 12(*b*) show the target value/value ranges where the difference between the minimum PhaseF and maximum PhaseF and the actual minimum PhaseF values, respectively, should converge.

Figure 13A:
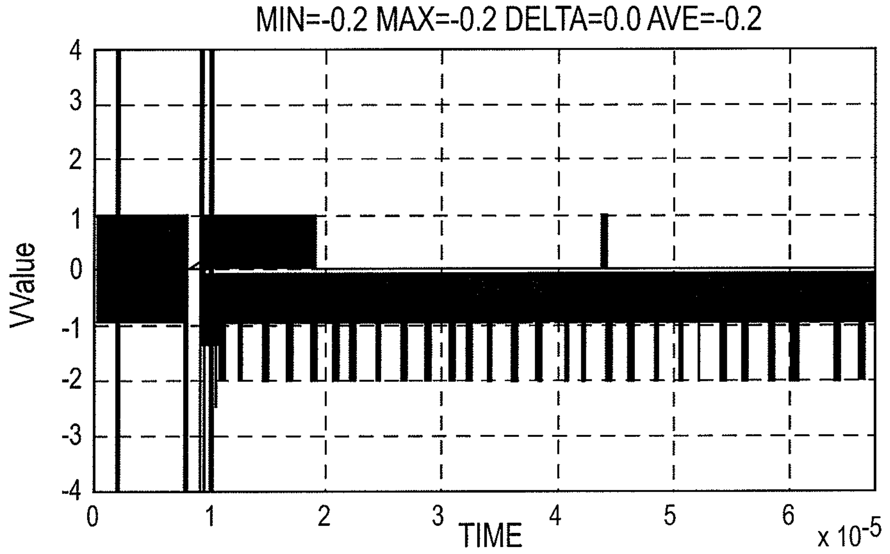
FIGS. 13A-13E depict additional simulated calibration results using the calibration process disclosed herein.
Figure 13B:
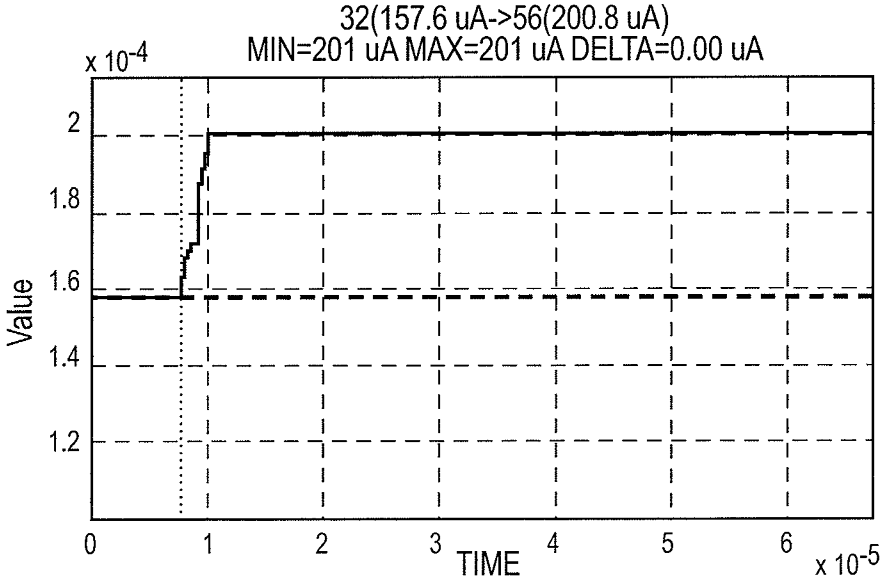
Figure 13C:
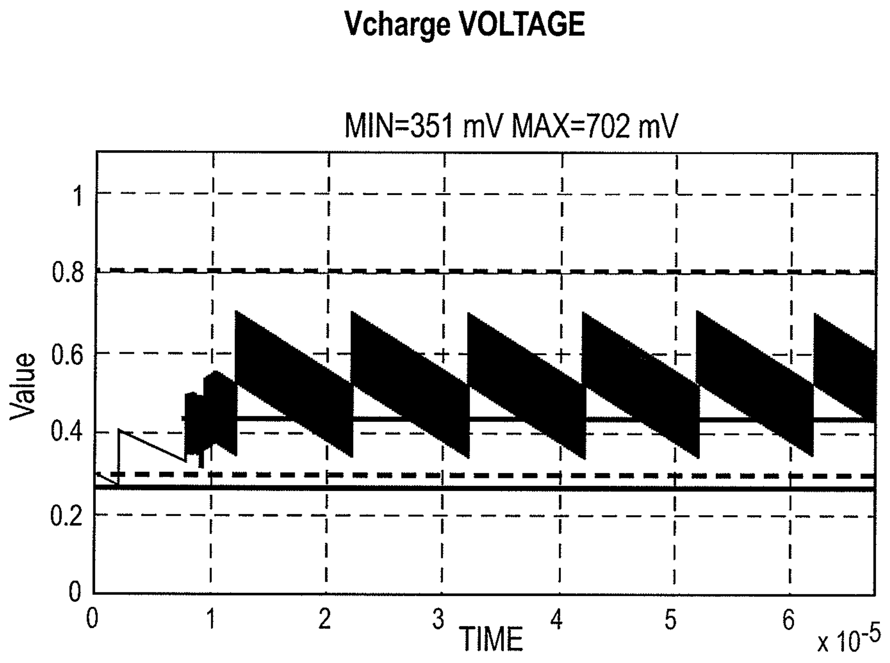
Figure 13D:
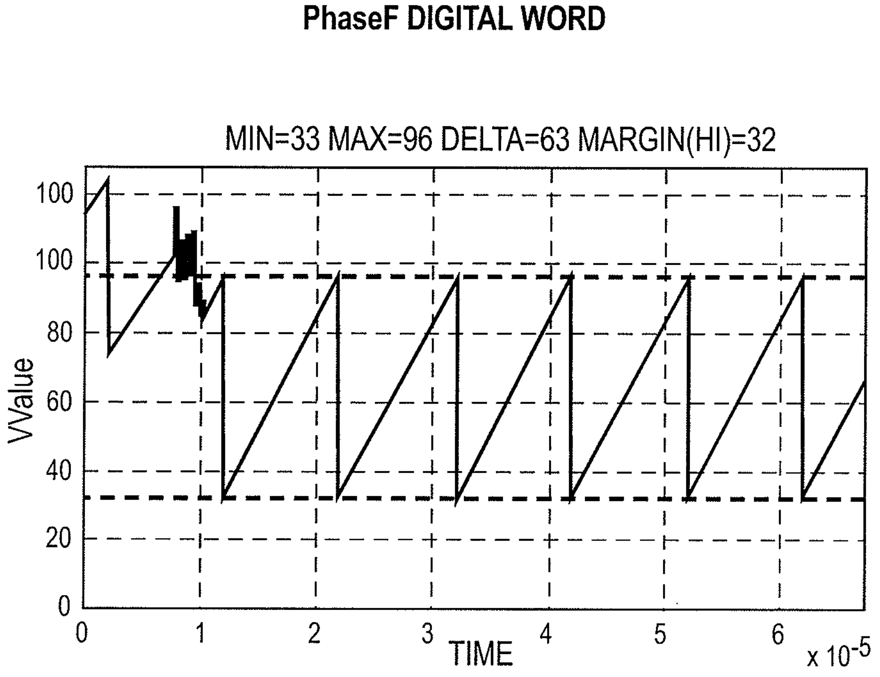
Figure 13E:
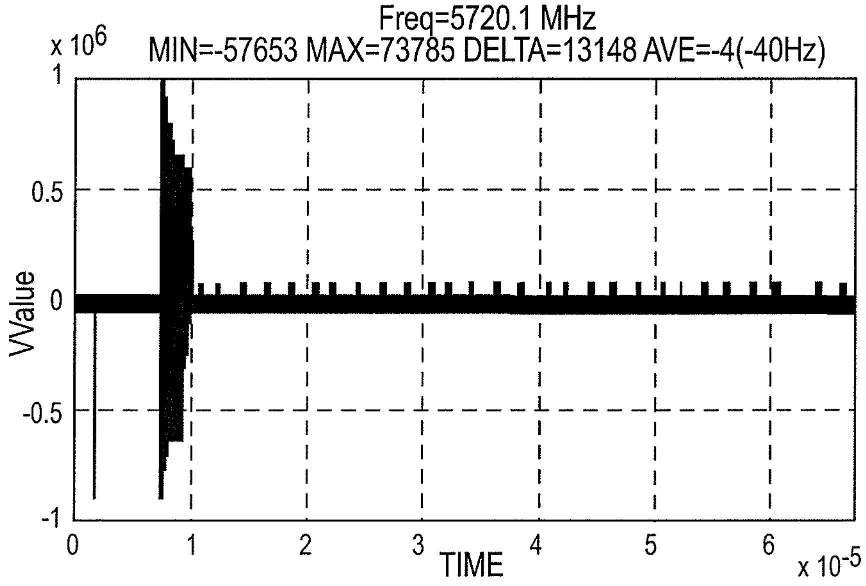

FIGS. 13A-13E show an exemplary simulation of the calibration process associated with FIG. 10. The parameters used for this simulation include an oscillator input frequency of 5720.1 MHz, an initial charge current of $I_{chg}$=158 μA (tunable up to 201 μA), and a target difference between the maximum PhaseF and the minimum PhaseF of 63. The cycling of the calibration can be seen with the envelope of the charge voltage in FIG. 13C. FIG. 13A shows the ripple (~8) generated by the gain error where the gain error measurement and the calibration begins. The gain error is monitored digitally in phase detector 22. To minimize the gain error, the charge current is tuned (FIG. 13B) so as to minimize the ripple in PhaseF (FIG. 13D), which causes the converter to be optimized for certain frequencies, as shown by the frequency error data of FIG. 13E. It will be appreciated that the gain error measurement result can also be used to tune the digital gain scaling factor.

While FIGS. 2, 4, 7, and 9 show the start and stop signals as being applied to the measurement unit 120, it will be appreciated that the start and stop signals may alternatively be applied to the charging unit 110 when the corresponding switches are also included in the charging unit 110. For example, in one embodiment the start signal is generally applied to switch $S_3$ (and optionally switch $S_2$) and the stop signal is generally applied to switch $S_1$. If the start and stop signals are applied to the chagrining unit 110 instead of the measurement unit 120, it will be appreciated that the switches controlled by the start and stop signals will also be part of the charging unit 110 in such a way as to make the same type of connections shown in FIGS. 7 and/or 9.

The present invention may, of course, be carried out in other ways than those specifically set forth herein without departing from essential characteristics of the invention. The present embodiments are to be considered in all respects as illustrative and not restrictive, and all changes coming within the meaning and equivalency range of the appended claims are intended to be embraced therein.

What is claimed is:

1. A method of calibrating at least one of a capacitive load and a charging current controlling a charge-to-digital timer, the method comprising:
- initializing the capacitive load and the charging current;
- applying first start and stop signals to the charge-to-digital timer to measure a first calibration phase during a first calibration period, said first start and stop signals separated in time by a first number of oscillator cycles;
- applying second start and stop signals to the charge-to-digital timer to measure a second calibration phase during a second calibration period, said second start and stop signals separated in time by a second number of oscillator cycles having a known relationship to the first number of oscillator cycles; and
- adjusting at least one of the capacitive load and the charging current based on the first and second calibration phases.

2. The method of claim 1 wherein adjusting at least one of the capacitive load and the charging current comprises:
- comparing the first calibration phase to a first threshold or comparing the second calibration phase to a second threshold;
- subtracting the first and second calibration phases to determine a calibration difference;
- comparing the calibration difference to a difference threshold; and
- adjusting at least one of the capacitive load and the charging current based on the comparisons.

3. The method of claim 2 wherein the capacitive load comprises a first variable capacitor and a second variable capacitor, and wherein adjusting at least one of the capacitive load and the charging current comprises adjusting the first variable capacitor based on the comparison between the calibration difference and the difference threshold, and adjusting the second variable capacitor based on the comparison between the first calibration phase and the first threshold.

4. The method of claim 2 wherein the capacitive load comprises a first variable capacitor and a second variable capacitor, and wherein adjusting at least one of the capacitive load and the charging current comprises adjusting the first variable capacitor based on the comparison between the calibration difference and the difference threshold, and adjusting the second variable capacitor based on the comparison between the second calibration phase and the second threshold.

5. The method of claim 2 wherein:
- applying the first start and stop signals comprises:
  - applying the first start signal to the charge-to-digital timer during the first calibration period;
  - applying the first stop signal to the charge-to-digital timer during the first calibration period the first number of oscillator cycles after applying the first start signal; and
  - storing the first calibration phase output by the charge-to-digital timer after applying the first stop signal; and
- applying the second start and stop signals comprises:
  - applying the second start signal to the charge-to-digital timer during the second calibration period;
  - applying the second stop signal to the charge-to-digital timer during the second calibration period the second number of oscillator cycles after applying the second start signal; and
  - storing the second calibration phase output by the charge-to-digital timer after applying the second stop signal.

6. The method of claim 2,
- wherein applying the first start and stop signals and the second start and stop signals comprises repeatedly applying the first start and stop signals, followed by the second start and stop signals during a measurement control loop, wherein the measurement control loop comprises a plurality of consecutive first and second calibration periods;
- wherein the first and second calibration phases are determined during a calculation loop running in parallel with the measurement control loop, wherein one or more first calibration phases are determined for one or more corresponding first calibration periods, and wherein one or more second calibration phases are determined for one or more corresponding second calibration periods;
- wherein comparing the first calibration phase to the first threshold or comparing the second calibration phase to the second threshold comprises:
  - tracking the first calibration phases determined during the calculation loop to determine a minimum calibration phase;
  - tracking the second calibration phases determined during the calculation loop to determine a maximum calibration phase; and
  - comparing the minimum calibration phase to the first threshold or comparing the maximum calibration phase to the second threshold; and
- wherein subtracting the first and second calibration phases comprises subtracting the minimum and maximum calibration phases to determine the calibration difference.

7. The method of claim 1 wherein calibrating the charge-to-digital timer comprises calibrating the charge-to-digital timer, responsive to a calibration instruction, during an open-loop process independent from closed-loop operations of the charge-to-digital timer.

8. The method of claim 7 further comprising subtracting the first and second calibration phases to compute a calibration difference, and estimating a scaling factor applied to phases determined during the closed-loop operations based on the computed calibration difference.

9. The method of claim 1 wherein adjusting at least one of the capacitive load and the charging current comprises:

counting an integer number of oscillator cycles between the first start and stop signals to determine a first integer phase;

counting an integer number of oscillator cycles between the second start and stop signals to determine a second integer phase;

wherein the first calibration phase comprises a first fractional phase and the second calibration phase comprises a second fractional phase;

subtracting the first and second integer phases to determine a first instantaneous frequency;

subtracting the first and second fractional phases to determine a second instantaneous frequency; and adjusting at least one of the capacitive load and the charging current based on the first and second frequencies.

10. The method of claim 9 wherein the capacitive load comprises a first variable capacitor, and wherein adjusting at least one of the capacitive load and the charging current comprises adjusting at least one of the first variable capacitor and the charging current based on the first and second instantaneous frequencies.

11. The method of claim 9 wherein calibrating the charge-to-digital timer comprises calibrating the charge-to-digital timer during closed-loop operations of the charge-to-digital timer.

12. The method of claim 11 further comprising estimating a scaling factor during the closed-loop operations based on the second instantaneous frequency, and scaling instantaneous fractional phases determined during the closed-loop operations independent from the calibration operations using the scaling factor.

13. The method of claim 1 wherein the first and second calibration periods each comprise a full oscillator cycle.

14. The method of claim 1 wherein the first number of oscillator cycles comprises m oscillator cycles, and the second number of oscillator cycles comprises m+n oscillator cycles.

* * * * *